United States Patent [19] [11] 3,740,670
Hoffman [45] June 19, 1973

[54] INTEGRAL RF MODAMP

[75] Inventor: Gary Robert Hoffman, Baltimore, Md.

[73] Assignee: The Bendix Corporation, Southfield, Mich.

[22] Filed: May 15, 1972

[21] Appl. No.: 253,373

[52] U.S. Cl. .................. 332/18, 307/264, 325/147, 330/103

[51] Int. Cl. .............................................. H03c 3/08

[58] Field of Search ................. 332/18, 16 R, 16 T, 332/37 R, 37 D; 307/264; 325/147, 148, 184; 330/103, 90, 94, 95

[56] References Cited

UNITED STATES PATENTS 3,035,234 5/1962 Hillman ........................... 332/18 X
2,469,218 5/1949 Thomas ................................ 332/18
3,460,041 8/1969 Orwin et al. .................. 332/37 R X

*Primary Examiner*—Alfred L. Brody
*Attorney*—W. G. Christoforo

[57] ABSTRACT

An RF modulator amplifier in a first feedback loop includes a comparator which produces an error signal whenever the audio input differs from a sampled portion of an AM modulated output. The error signal controls the current supply to the last RF amplifier stage. The voltage at the last RF amplifier stage is maintained constant by a second feedback loop which includes a voltage detector which senses this voltage to generate a second error signal which is used to set the drive of first and second RF amplifiers.

10 Claims, 3 Drawing Figures

INTEGRAL RF MODAMP

BACKGROUND OF THE INVENTION

This invention relates to radio frequency amplifiers which include an integral modulator, the device herein being termed a modamp, and relates more particularly to such modamps which are used for AM modulation.

Modulation is normally performed prior to RF amplification so that linear RF amplifiers have been required to minimize distortion of the output signal. Accordingly, Class A amplifier circuits have been required with resultant low efficiency operation. Another technique used for modulating an RF signal is to modulate the power supply which supplies power to the RF amplifier stages. This technique produces efficiencies generally of about 35 percent. Using this technique, however, a linear power supply voltage is required. In addition, the generally low efficiency of RF amplifiers and modulators in portable and mobile communications equipment results in a reduced system battery life.

SUMMARY OF THE INVENTION

The integral RF modamp to be described modulates an RF carrier more efficiently than has heretofore been possible, that is, the ratio of output RF power with respect to DC input is maximized. In addition, the distortion of this new circuit is low so that the need for linear circuits is eliminated as is the need for an external modulator.

The circuit to be described includes a final RF amplifier stage whose output comprises the input to a radiating antenna. The modulation on the output signal is sampled by a novel detector and is applied, after being attenuated and filtered, as one input to a differential amplifier comparator. The audio signal which is used to modulate the RF carrier is applied as a second input to the comparator. The comparator error signal is used to control the current flow in the final RF amplifier. The comparator and current control circuit comprise a first circuit feedback loop.

The reference voltage at the final RF amplifier stage is maintained constant by a second feedback loop which includes a voltage detector for generating a second error signal when the aforementioned final RF amplifier reference voltage tends to vary in response to the varying current flow. The second error signal is used to control the bias at the earlier RF amplifiers.

Since modulation of the RF carrier is performed at the last RF amplifier stage the need for linear RF amplifier circuits is eliminated. In addition, since the modulation of the RF output signal is compared directly against the input audio and the modulation controlled in accordance therewith, distortion will be very low. In addition, the second feedback loop which maintains the reference voltage at the final RF amplifier stage constant by varying the bias at the earlier RF amplifier stages results in a modamp of relatively high efficiency.

It is an object of this invention to provide an integral RF amplifier and modulator.

It is another object of this invention to provide an RF modamp which eliminates the need for linear RF amplifier circuits.

It is another object of this invention to provide an RF modamp having low distortion and high efficiency.

A further object of this invention is to provide a novel detector which can be used to protect transmitter circuits from the effects of standing waves on the transmitter antenna.

A still further object of this invention is to provide a novel detector which eliminates AM distortion caused by antenna VSWR.

DESCRIPTION OF THE PREFERRED EMBODIMENT

Figure 1:
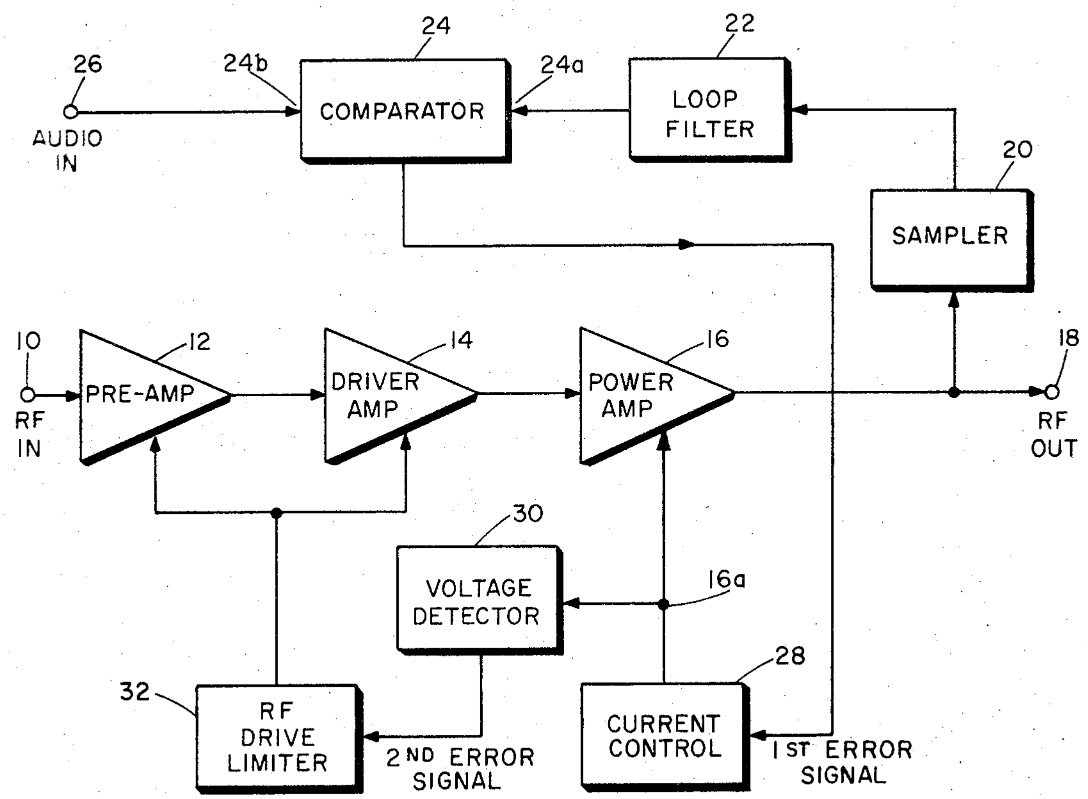
FIG. 1 is a block diagram which illustrates the principles of the invention.

Refer now to the figures wherein like reference numerals refer to like elements and refer particularly to FIG. 1. In this figure, an RF carrier signal to be amplified and modulated with an audio signal is impressed at input terminal 10. An output terminal 18 is suitably connected to a transmitting antenna (not shown). Three stages of RF amplification are connected between input terminal 10 and output terminal 18, these stages comprising preamplifier 12, driver amplifier 14 and power amplifier 16. The output RF signal is sampled by a sampler 20 comprised of a diode means as will be explained below. The sampled signal is applied to a loop filter 22 where the RF portion of the signal is substantially removed and the modulation, usually audio, portion is attenuated. The attenuated modulation signal is applied as one input to a comparator 24. An input signal to modulate the RF signal is impressed at terminal 26 and applied as the second input to the comparator 24. The modulation signal at terminal 24*a* is forced to follow and conform to the input signal at terminal 24*b* by the error signal which is generated by comparator 24 and which is applied to a current control circuit 28 which controls the power delivered by the power amplifier 16.

The reference voltage of power amplifier 16, that is, the voltage at terminal 16*a*, is maintained constant regardless of the current flow therethrough in the following manner. The voltage at this terminal is sensed by voltage detector 30 which generates a second error signal whenever this constant voltage tends to vary. The second error signal is applied to an RF drive limiter circuit 32 which in accordance therewith controls the bias or drive of preamplifier 12 and driver amplifier 14.

Figure 2:
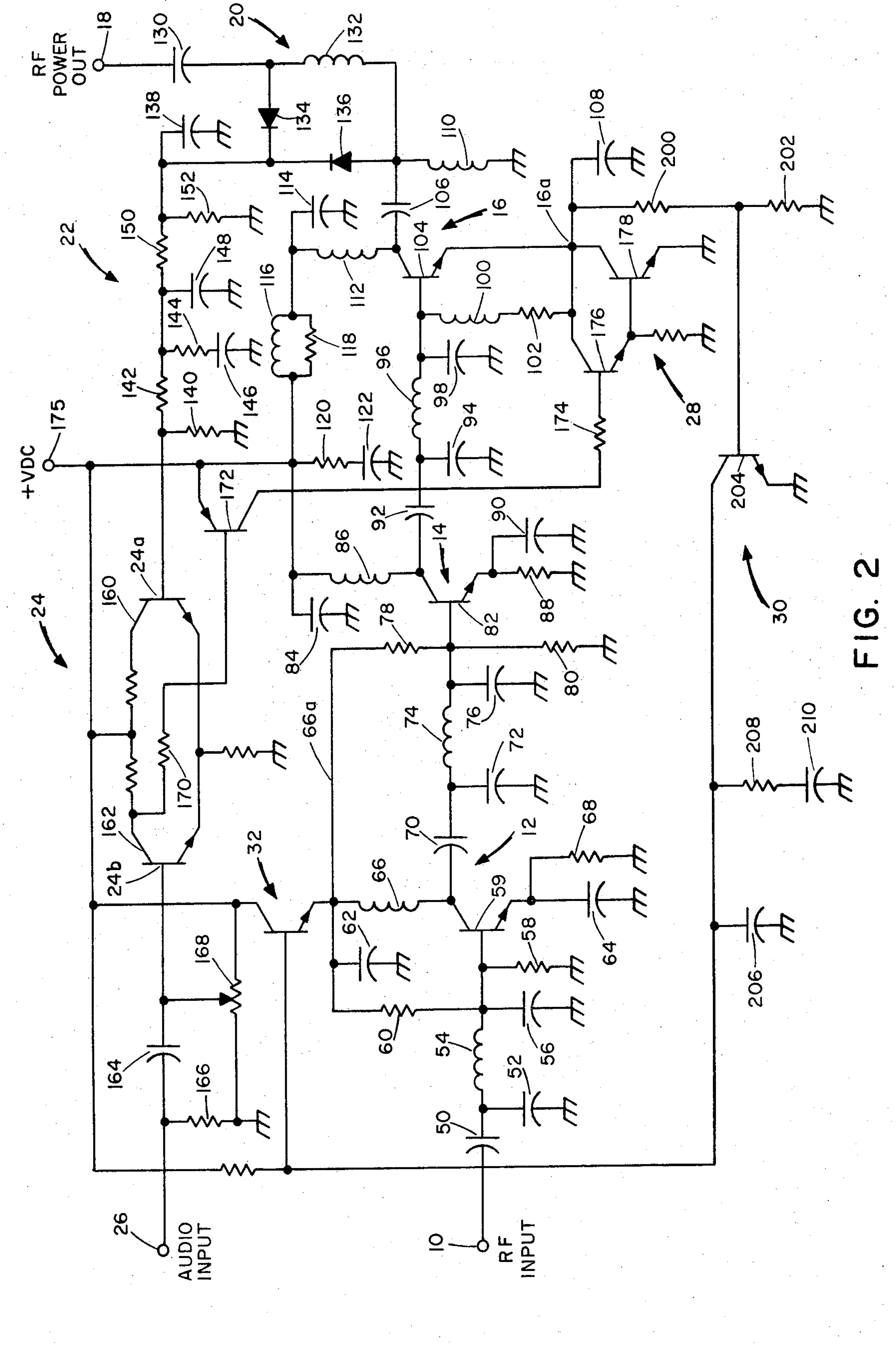
FIG. 2 is an exemplary schematic which is useful in more particularly explaining the principles of the invention.

Refer now to FIG. 2 which shows a schematic of the circuit illustrated in FIG. 1. As before, the RF input signal is impressed at terminal 10 and applied through the impedance matching circuit comprised of capacitors 50, 52 and 56 and inductance 54 to the base electrode of NPN transistor 59. Transistor 59 together with resistors 58, 60 and 68 and capacitors 62 and 64 and inductor 66 comprise the preamplifier 12. The preamplifier output signal at the collector electrode of transistor 59 is applied through the impedance matching network comprised of capacitors 70, 72 and 76 and inductance 74 to the base electrode of a second NPN transistor 82. This transmitter together with capacitors 84 and 90, resistor 80 and inductance 86 comprise the driver amplifier 14. The output of this amplifier at the collector electrode of transistor 82 is applied through a further impedance matching network comprised of capacitors 92, 94 and 98 and inductance 96 to the base electrode of NPN transistor 104. This transistor together with capacitors 106, 108, 114 and 122, inductances 100, 112 and 116 and resistors 102, 118 and 120 comprise the RF power amplifier 16.

The output from the RF power amplifier is applied through inductance 132 and capacitor 130 to the RF power output terminal 18. Inductances 110 and 132 together with diodes 134 and 136 and capacitors 130 and 138 comprise a sampler for sampling the RF power output signal. Inductor 132 suitably comprises a length of coaxial line suitable for delaying the RF power output signal by 90°. The purpose of this will be made clear below.

A loop filter comprised of resistors 140, 142, 144, 150 and 152 and capacitors 146 and 148 removes the RF component from the sampled signal and attenuates the modulation portion. The attenuated signal is applied to the base electrode of NPN transistor 160 which together with NPN transistor 162, connected in a differential configuration, comprise the differential comparator 24. The base electrode of transistor 160 comprises comparator input port 24*a* also seen in FIG. 1. The base electrode of transistor 162 comprises the second comparator input port 24*b* also seen in FIG. 1. The input signal at terminal 26 is coupled through capacitor 164 to comparator input terminal 24*b*. The DC level at input terminal 24*b* is set by manipulation of the slider of potentiometer 168 which is connected between the positive voltage terminal 175 and ground. The input impedance at terminal 26 is determined by resistor 166 which is connected between that terminal and ground.

The error signal from comparator 24 appears at the collector electrode of transistor 162 and is coupled through resistor 170 to the base electrode of PNP transistor 172 whose emitter electrode is connected directly to the positive voltage terminal 175. The collector electrode of transistor 172 is coupled through resistor 174 to the base electrode of NPN transistor 176. Transistor 176 is connected to NPN transistor 178 in a Darlington configuration, where their common collector electrodes are connected to the emitter of transistor 104. The error signal from comparator 24 operating through the Darlington circuit, which comprises current control 28, controls the emitter current of transistor 104, that is, it controls the current flow in power amplifier 16.

The voltage at the emitter of the power amplifier transistor 104, that is at point 16*a*, is sensed at the base electrode of NPN transistor 204 through the voltage divider comprised of resistors 200 and 202. Transistor 204 together with the voltage divider comprises the voltage detector 30. A loop filter comprised of capacitors 206 and 210 and resistor 208 is connected to the collector electrode of transistor 204 to remove the high frequencies therefrom. The collector electrode of transistor 204, on which appears the second error signal, is connected to the base electrode of NPN transistor 32 which comprises the RF drive limiter. The collector electrode of this transistor is connected to the positive voltage terminal and its emitter electrode is connected through the voltage divider comprised of resistors 58 and 60 to the base of transistor 59 and through the voltage divider comprised of resistors 78 and 80 to the base electrode of transistor 82. The RF drive limiter 32 will now adjust the DC bias at the base electrode of transistors 59 and 82 so as to maintain the voltage at the emitter electrode of transistor 104 constant. In other words, the RF drive limiter is used as a series modulator to alter the RF drive level to the power amplifier in response to the second error signal. This technique provides gain control and RF drive limit to the power amplifier.

It will be noted that transistors 32 and 59 are so connected that generally a common current flows therethrough, the emitter electrode of transistor 32 being connected to the collector electrode of transistor 59 through inductor 66. This permits transistor 32 to be operated in a more linear portion of its characteristic curve.

Generally, the voltage at point 16*a* is maintained at a relatively low voltage so that only small amounts of power are dissipated by transistors 176 and 178. These transistors comprise a current limiting or voltage variable emitter resistor which determines the amount of current drawn through transistor 104. Without the second feedback loop through transistors 204 and 32 the voltage at point 16*a* would not remain constant as the current demanded by transistors 176 and 178 varied. As a result the RF power output signal would be distorted and efficiently would be decreased. However, with the second feedback loop maintaining the voltage at point 16*a* constant the distortion problem is eliminated. In addition, the low voltage at point 16*a* determines that a major portion of power dissipated in the circuit will be dissipated in the power amplifier, hence resulting in improved circuit efficiency.

Diodes 134 and 136 which comprise sampler 20 operate as a peak envelope detector which converts the RF voltage at the power amplifier output to a DC level as a function of output power.

Figure 3:
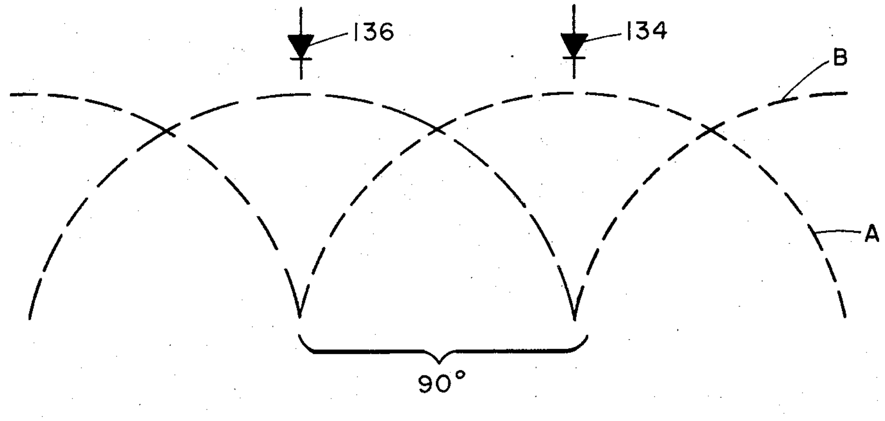
FIG. 3 shows representative standing waves at the output circuit and is helpful in describing the novel detector.

It was earlier explained that inductor 132 introduced a 90° time delay to the RF output power signal between the anode of diode 136 and the anode of diode 134. This delay protects the power amplifier from being exposed to destructive currents should the VSWR at the antenna become excessive and also substantially eliminates AM distortion caused by antenna VSWR. This will be explained with reference to FIG. 3. In that figure, curves A and B are seen where curve A represents a standing wave on the antenna and where curve B represents a second possible standing wave. Diodes 136 and 134 are represented as spaced by a 90° phase shift. If only diode 136 is used and the standing wave represented by curve A were present, the diode would detect no output signal and hence the feedback loop through comparator 24 would demand that further current be drawn through transistor 104 thus possibly destroying that transistor and in any event introducing AM distortion. However, with diode 134 present, this diode detects the peak of curve A and prevents excessive current from being drawn through the power amplifier. In like manner, if the standing wave produced by the high VSWR were to take the form of curve B, diode 134 would detect no signal while diode 136 would detect a peak signal and hence reduce the current flow through the power amplifier. The use of this novel circuit is optional with the system designer as a single detector can be used if standing waves are not to be compensated for or other means protecting against unwanted currents are employed.

Certain other modifications and alterations should now be obvious to one skilled in the art. For example, it should be obvious that the second feedback loop can be used to vary the drive of only one of the preamplifiers or driver amplifiers if desired while still practicing the invention. This can be accomplished by simply disconnecting one of the voltage dividers comprised of resistors 58 and 60 or 78 and 80. This also suggests that the invention can be practiced with only two stages of RF amplification. Accordingly, the invention is to be limited only by the true scope and spirit of the appended claims.

The invention claimed is:

1. A modamp comprising:

at least a first amplifier for amplifying an RF signal;

a power amplifier including a power transistor for further amplifying said RF signal, the further amplified RF signal comprising an output signal;

means for sensing the modulation on said output signal;

means comparing the sensed modulation with an input signal for generating a first error signal;

means responsive to said first error signal for controlling the current in said power transistor;

means for generating a second error signal in accordance with the voltage at said power transistor; and, means responsive to said second error signal for controlling the drive of said first amplifier whereby the voltage at said power transistor is maintained constant.

2. The modamp of claim 1 wherein said power transistor includes a first control electrode connected to receive the output from said first amplifier and additionally includes a second control electrode connected to said means for controlling current, the voltage at said second control electrode being maintained constant by said second error signal.

3. The modamp of claim 1 wherein said means for sensing comprises:

first unilateral current means connected to receive said output signal; and, second unilateral current means connected to receive said output signal delayed by 90°.

4. The modamp of claim 3 wherein said first and second unilateral current means comprises first and second diodes and means for delaying said output signal by 90°.

5. A modamp comprising:

a source of RF signals to be modulated and amplified;

a preamplifier including a first transistor having at least an input electrode connected to receive said RF signals and an output electrode;

a driver amplifier including a second transistor having at least an input electrode and an output electrode;

means for connecting said first transistor output electrode to said second transistor input electrode;

a power amplifier including a third transistor having at least an input electrode, an output electrode and a third electrode;

means for connecting said second transistor output electrode to said third transistor input electrode;

means connected to said third transistor output electrode for sampling the modulation content of the signal thereon;

a source of a modulation signal;

comparator means responsive to said modulation signal and the sampled signal for generating a first error signal;

means responsive to said first error signal for controlling the current flow in said third electrode; and, feedback means from said third transistor for maintaining the voltage at said third electrode constant.

6. The modamp of claim 5 wherein said feedback means comprises:

means responsive to the voltage at said third electrode for generating a second error signal; and, means responsive to said second error signal for varying the drive of at least one of said preamplifiers and said driver amplifiers.

7. The modamp of claim 6 wherein said means for varying the drive comprises means responsive to said second error signal for varying the DC bias at the input electrode of at least one of said first and second transistors.

8. The modamp of claim 5 wherein said means for sampling comprises:

at least one detector for sampling the signal on said third transistor output electrode; and, filter means for substantially removing the RF component from the signal sampled.

9. The modamp of claim 8 wherein said filter means includes means for attenuating the signal sampled.

10. The modamp of claim 5 wherein said means for sampling comprises:

a first detector means having a first end connected to said third transistor output electrode and a second end;

a second detector means having a first end and a second end, the first and second detector means second ends being connected together; and, signal delay means for connecting said first detector means first end to said second detector means first end.

* * * * *